(12) United States Patent
Seo

(10) Patent No.: US 12,278,193 B2
(45) Date of Patent: Apr. 15, 2025

(54) SEMICONDUCTOR DEVICES INCLUDING RECOGNITION MARKS

(71) Applicant: SK hynix Inc., Icheon-si Gyeonggi-do (KR)

(72) Inventor: Hyun Chul Seo, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 672 days.

(21) Appl. No.: 17/522,602

(22) Filed: Nov. 9, 2021

(65) Prior Publication Data

US 2022/0415821 A1 Dec. 29, 2022

(30) Foreign Application Priority Data

Jun. 29, 2021 (KR) .................. 10-2021-0085111

(51) Int. Cl.
*H05K 1/02* (2006.01)
*H01L 23/00* (2006.01)
*H01L 23/48* (2006.01)
*H01L 23/544* (2006.01)

(52) U.S. Cl.
CPC ............ *H01L 23/544* (2013.01); *H01L 24/02* (2013.01); *H01L 24/05* (2013.01); *H01L 24/48* (2013.01); *H01L 24/85* (2013.01); *H01L 2223/54426* (2013.01); *H01L 2223/54473* (2013.01); *H01L 2224/0235* (2013.01); *H01L 2224/0236* (2013.01); *H01L 2224/02373* (2013.01); *H01L 2224/02375* (2013.01); *H01L 2224/02381* (2013.01); *H01L 2224/05548* (2013.01); *H01L 2224/05569* (2013.01); *H01L 2224/05573* (2013.01); *H01L 2224/48463* (2013.01); *H01L 2224/8513* (2013.01); *H01L 2224/85181* (2013.01)

(58) Field of Classification Search
CPC . H01L 2224/48463; H01L 2224/54473; H01L 2224/05573; H01L 2224/05548–05569; H01L 2224/02381; H01L 2224/02375; H01L 2224/0235; H01L 24/02–05; H01L 23/544

See application file for complete search history.

(56) References Cited

U.S. PATENT DOCUMENTS

| | | | | |
|---|---|---|---|---|
| 7,879,655 B2* | 2/2011 | Tsutsumi | ................ | H01L 24/49 438/666 |
| 8,084,279 B2* | 12/2011 | Kasaoka | ................ | H01L 24/05 257/E21.523 |
| 2022/0167495 A1* | 5/2022 | Chen | ................ | H05K 3/022 |

FOREIGN PATENT DOCUMENTS

| KR | 1020140035265 A | 3/2014 |
|---|---|---|
| KR | 1020200007509 A | 1/2020 |

* cited by examiner

*Primary Examiner* — Hoa B Trinh
(74) *Attorney, Agent, or Firm* — WILLIAM PARK & ASSOCIATES LTD.

(57) ABSTRACT

A semiconductor device includes a first redistribution layer pattern, a second redistribution layer pattern, and a recognition mark. The first redistribution layer pattern is formed on a semiconductor substrate. The second redistribution layer pattern, with a bonding pad portion, is disposed on the first redistribution layer pattern. Furthermore, the recognition mark is formed on the first redistribution layer pattern to indicate a position of the bonding pad portion.

27 Claims, 11 Drawing Sheets

SEMICONDUCTOR DEVICES INCLUDING RECOGNITION MARKS

CROSS-REFERENCE TO RELATED APPLICATIONS

The present application claims priority under 35 U.S.C 119(a) to Korean Applications No. 10-2021-0085111, filed on Jun. 29, 2021, which is incorporated herein by reference in its entirety.

BACKGROUND

1. Technical Field

The present disclosure relates to a semiconductor technology, and more particularly, to semiconductor devices including recognition marks.

2. Related Art

A semiconductor device may include a semiconductor substrate, such as a wafer. An integrated circuit may be integrated into the semiconductor substrate. The semiconductor device may include bonding pads for electrical connection with an external device. The semiconductor device may include redistribution layer (RDL) patterns. The redistribution layer patterns may be connected to bonding pads or may extend from bonding pads. The redistribution layer patterns may electrically connect the bonding pads to the integrated circuits therein. Interconnection structures, such as bonding wires, may be connected to the bonding pads. The interconnection structure may electrically connect the semiconductor device and the package substrate to each other. The semiconductor device may be mounted on a package substrate to configure a semiconductor package. The interconnection structure may electrically connect the semiconductor device and other semiconductor devices to each other.

SUMMARY

An embodiment of the present disclosure may provide a semiconductor device including a first redistribution layer pattern formed on a semiconductor substrate; a second redistribution layer pattern, with a bonding pad portion, disposed on the first redistribution layer pattern; and a recognition mark formed on the first redistribution layer pattern to indicate a position of the bonding pad portion.

Another embodiment of the present disclosure may provide a semiconductor device including a first redistribution layer pattern formed on a semiconductor substrate; a second redistribution layer pattern, with a bonding pad portion, disposed on the first redistribution layer pattern; and a recognition mark to indicate a position of the bonding pad portion. The recognition mark includes an opening portion from which a portion of the first redistribution layer pattern is removed. The bonding pad portion is disposed to overlap an inner region of the opening portion and to expose an edge region of the opening portion.

Another embodiment of the present disclosure may provide a semiconductor device including a redistribution layer pattern formed on a semiconductor substrate, the redistribution layer pattern including a plurality of trench portions that expose recognition marks; a plurality of bonding pad portions overlapping with the redistribution layer pattern such that edges thereof contact the trench portions in a plan view; and bonding wires bonded to the bonding pad portions.

Another embodiment of the present disclosure may provide a semiconductor device including a first redistribution layer pattern formed on a semiconductor substrate; a second redistribution layer pattern, with a bonding pad portion that overlaps with the first redistribution layer pattern, disposed on the first redistribution layer pattern; and a trench portion formed in the first redistribution layer pattern in a shape that surrounds the bonding pad portion in a plan view.

DETAILED DESCRIPTION

Figure 1:
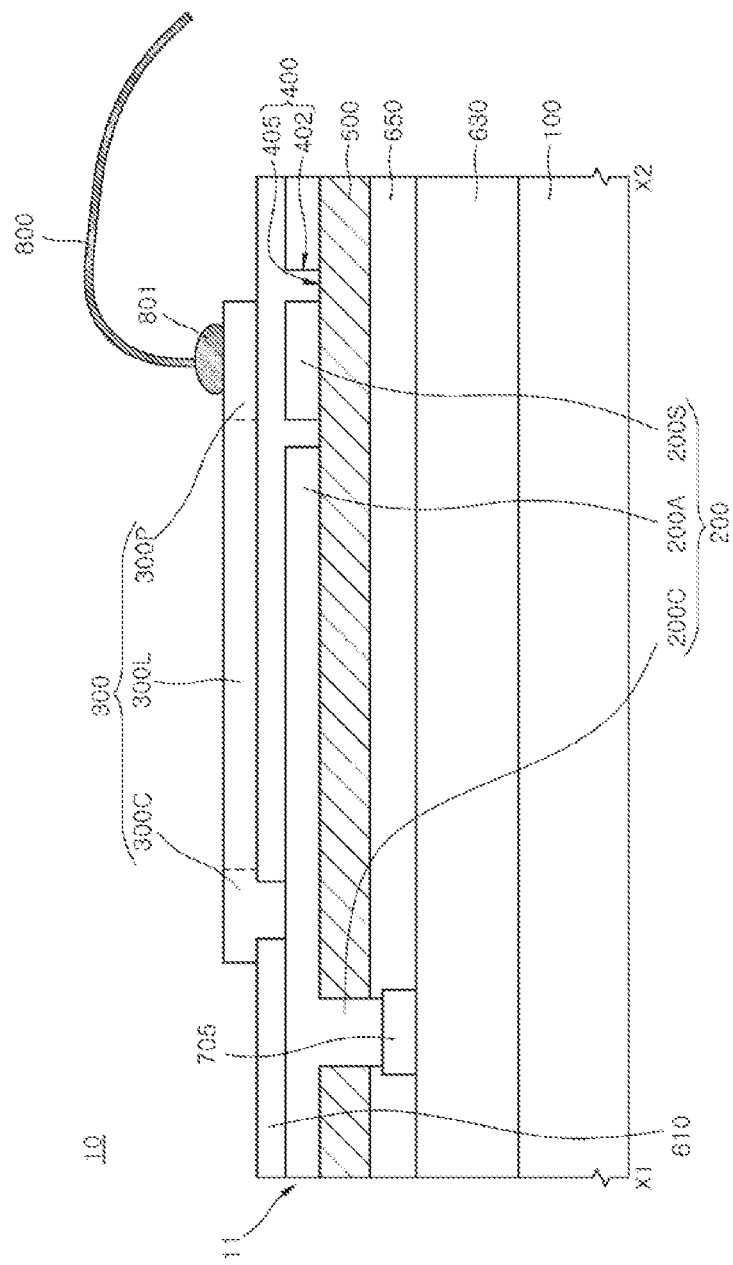
FIG. 1 is a schematic cross-sectional view illustrating a cross-sectional shape of a semiconductor device according to an embodiment of the present disclosure.

The terms used in the description of the embodiments of the present disclosure are terms selected in consideration of functions in the presented embodiments, and the meaning of the terms may vary according to the intention or custom of users or operators in the technical field. The meanings of the terms used are in accordance with the defined definitions when specifically defined in the present disclosure, if there is no specific definition, it may be interpreted as the meaning generally recognized by those skilled in the art.

In the description of the embodiments of the present disclosure, descriptions such as "first", "second", "side", "top" and "bottom or lower" are to distinguish subsidiary materials, not used to limit the subsidiary materials themselves or to imply any particular order.

The semiconductor device may include a semiconductor substrate or a structure in which plurality of semiconductor substrates are stacked. The semiconductor device may indicate a semiconductor package structure in which a structure in which semiconductor substrates are stacked is packaged. Semiconductor substrates may refer to semiconductor wafers, semiconductor dies or semiconductor chips on which electronic components and elements are integrated. The semiconductor chip may refer to a memory chip in which a memory integrated circuit such as DRAM, SRAM, NAND FLASH, NOR FLASH, MRAM, ReRAM, FeRAM, or PcRAM is integrated, or a logic die in which a logic circuit is integrated on a semiconductor substrate or a processor such as an ASIC chip, an application processor (AP), a graphic processing unit (GPU), a central processing unit (CPU), or a system on a chip (SoC). The semiconductor device may be applied to information communication devices such as portable terminals, bio or health care related electronic devices, and wearable electronic devices. The semiconductor device may be applied to the Internet of Things.

The same reference numerals may refer to the same elements throughout the present disclosure. The same reference numerals or similar reference numerals may be described with reference to other drawings, even if they are not mentioned or described in the corresponding drawings. Further, even if a reference numeral is not indicated, it may be described with reference to other drawings.

FIG. 1 is a schematic cross-sectional view illustrating a cross-sectional shape of a semiconductor device 10 according to an embodiment of the present disclosure.

Referring to FIG. 1, the semiconductor device 10 may include a semiconductor substrate 100, a first redistribution layer pattern (first RDL pattern) 200, a second redistribution layer pattern 300, and a recognition mark 400. An integrated circuit or a memory circuit may be configured on the semiconductor substrate 100. For example, active elements, such as transistors, may be configured on the semiconductor substrate 100, Passive elements, such as capacitors, may be configured on the semiconductor substrate 100. These active elements or the passive elements may configure an integrated circuit or a memory circuit. The integrated circuit or memory circuit may include a DRAM device or a NAND device.

The first redistribution layer pattern 200 may be formed on the semiconductor substrate 100. The second redistribution layer pattern 300 may be formed over the first redistribution layer pattern 200. The second redistribution layer pattern 300 may substantially overlap with the first redistribution layer pattern 200. The overlapping portion of the second redistribution layer pattern 300 may be substantially parallel to the first redistribution layer pattern 200, spaced apart with the second redistribution layer pattern 300 in the vertical direction. The recognition mark 400 may be formed in the first redistribution layer pattern 200. The recognition mark 400 may be formed as a pattern with a predetermined shape in the first redistribution layer pattern 200.

A first dielectric layer 500 may be formed between the semiconductor substrate 100 and the first redistribution layer pattern 200. The first redistribution layer pattern 200 may be formed on the first dielectric layer 500. A second dielectric layer 610 may be further disposed between the first redistribution layer pattern 200 and the second redistribution layer pattern 300. The second dielectric layer 610 may be formed to cover the first redistribution layer pattern 200. A third dielectric layer 630 may be further disposed between the first dielectric layer 500 and the semiconductor substrate 100. The third dielectric layer 630 may be formed of an inter-metal dielectric (IMD) layer. The inter-metal dielectric layer may be an insulating layer that is disposed between metallization layers and may insulate the metallization layers from each other.

A first contact pattern 705 may be disposed between the third dielectric layer 630 and the first dielectric layer 500, The first contact pattern 705 may be a conductive pattern that is connected to lower metallization layers. The first contact pattern 705 may have a shape of a conductive pad that is connected to the lower metallization layers. The first redistribution layer pattern 200 may be connected to the first contact pattern 705.

The first redistribution layer pattern 200 may include a first contact portion 200C, a plate portion 200A, and a pad overlapping portion 200S. The first contact portion 200C of the first redistribution layer pattern 200 may be a portion of the first redistribution layer pattern 200 that overlaps with the first contact pattern 705, The pad overlapping portion 200S of the first redistribution layer pattern 200 may be a portion that is spaced apart from the first contact portion 200C, and the plate portion 200A of the first redistribution layer pattern 200 may be an intermediate portion that connects the first contact portion 200C and the pad overlapping portion 200S. The first contact portion 200C of the first redistribution layer pattern 200 may be connected to the first contact pattern 705, and the first redistribution layer pattern 200 may be connected to the integrated circuit that is formed in the semiconductor substrate 100 through the first contact pattern 705 and the metallization layers. A fourth dielectric layer 650 may be further formed between the first dielectric layer 500 and the third dielectric layer 630 as an insulating layer that insulates the first contact pattern 705.

A semiconductor chip 11 may include the semiconductor substrate 100, the first redistribution layer pattern 200, the second redistribution layer pattern 300, and the first dielectric layer 500. The semiconductor chip 11 may be a unit component that is separated from a wafer. The semiconductor chip 11 may be mounted on a package substrate (not illustrated) and encapsulated with an encapsulant. Accordingly, a semiconductor package in which the semiconductor chip 11 is packaged may be configured.

Figure 2:
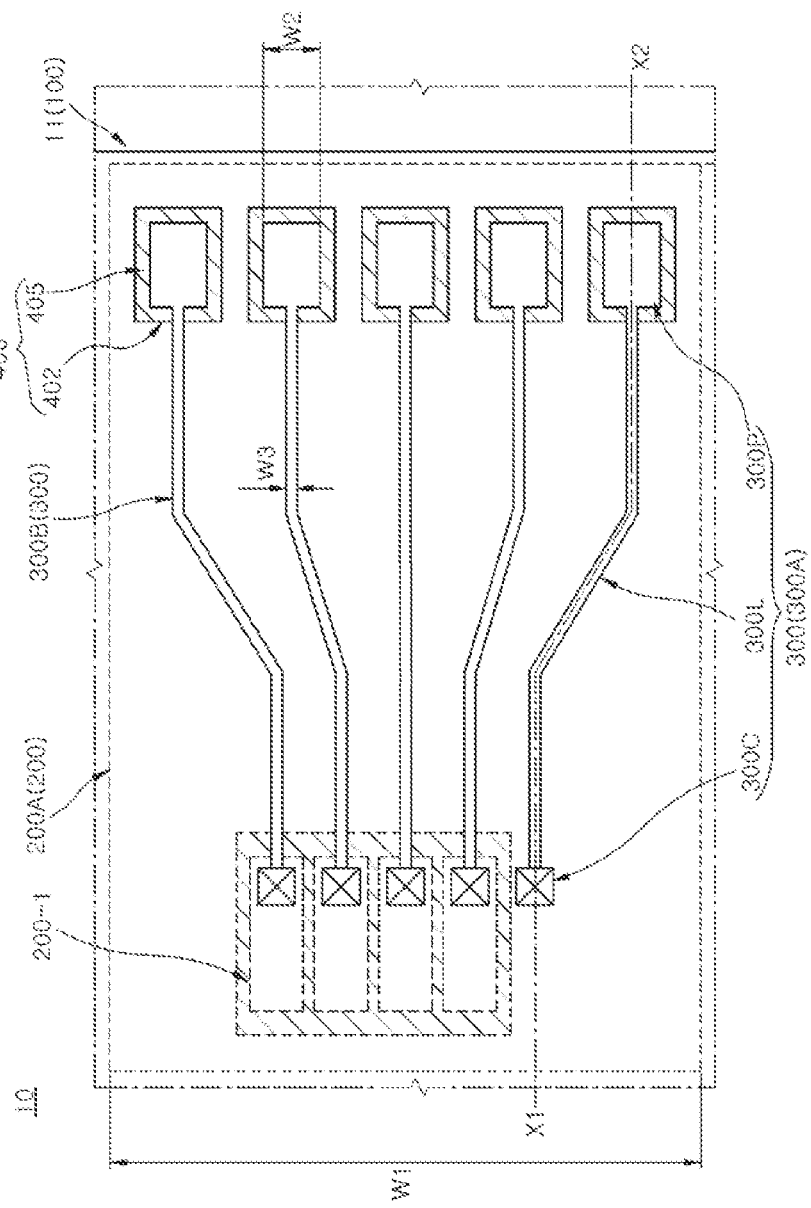
FIG. 2 is a schematic plan view illustrating a planar shape in which first and second redistribution layer patterns of the semiconductor device of FIG. 1 overlap with each other.
Figure 3:
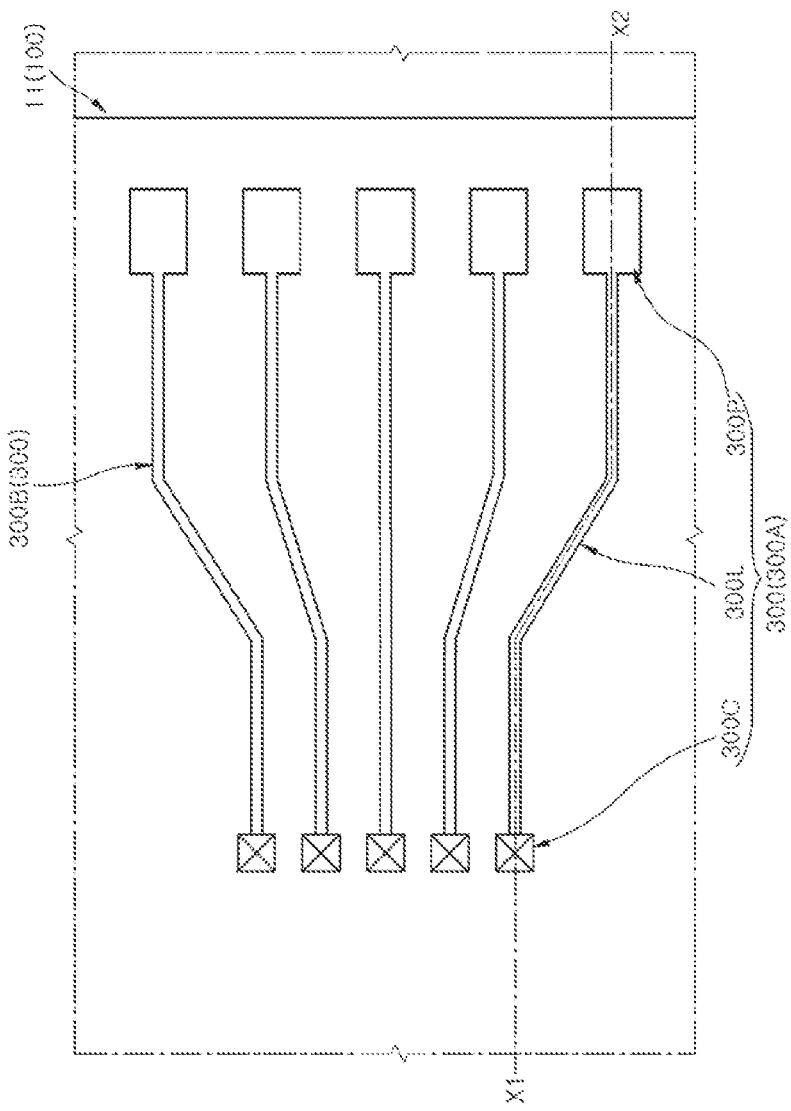
FIG. 3 is a schematic plan view illustrating planar shapes of the second redistribution layer patterns of the semiconductor device of FIG. 1.
Figure 4:
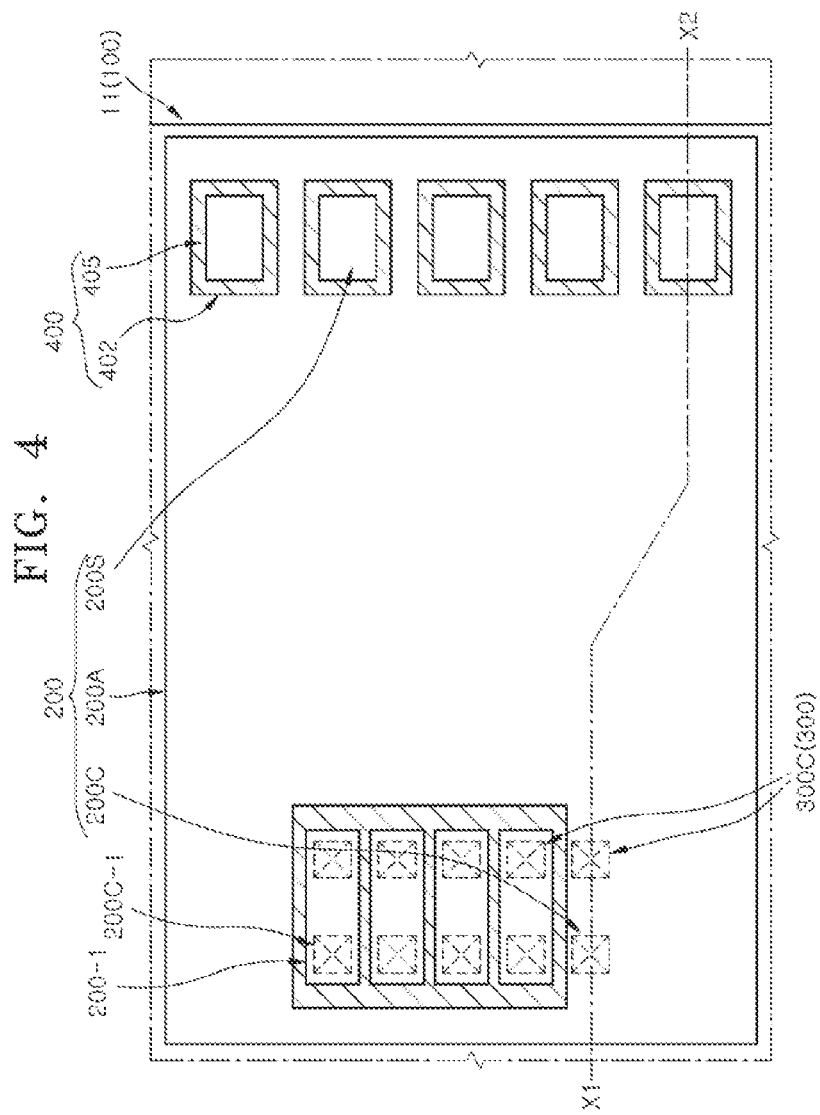
FIG. 4 is a schematic plan view illustrating a planar shape of the first redistribution layer pattern of the semiconductor device of FIG. 1.

The semiconductor device 10 may further include an interconnection structure that is connected to the semiconductor chip 11. The interconnect structure may include a bonding wire 800 that is connected to the semiconductor chip 11. The bonding wire 800 may be connected to a portion of the second redistribution layer pattern 300. One end 801 of the bonding wire 800 may be bonded to a bonding pad portion 300P that is provided by the second redistribution layer pattern 300, FIG. 2 is a schematic plan view illustrating a planar shape in which first and second redistribution layer patterns 200 and 300 of the semiconductor device 10 of FIG. 1 overlap with each other. FIG. 1 may be a schematic cross-sectional view illustrating a cross-sectional shape along the line X1-X2 of FIG. 2. FIG. 3 is a schematic plan view illustrating a planar shape of the second redistribution layer patterns 300 of FIGS. 1 and 2. FIG. 4 is a schematic plan view illustrating a planar shape of the first redistribution layer pattern 200 of FIGS. 1 and 2.

Referring to FIGS. 1 and 2, the second redistribution layer patterns 300 may substantially overlap with the first redistribution layer pattern 200. In a cross-section side view, the second redistribution layer patterns 300 may be disposed at positions that are spaced apart from the first redistribution layer pattern 200 by a certain height in a direction that is substantially perpendicular to the semiconductor substrate 100. A second dielectric layer 610 may be disposed between the second redistribution layer patterns 300 and the first redistribution layer pattern 200. The second redistribution layer patterns 300 may be formed on the second dielectric layer 610. FIG. 2 illustrates the planar shapes of the first and second redistribution layer patterns 200 and 300 excluding the second dielectric layer 610.

Referring to FIGS. 2 and 3, each of the second redistribution layer patterns 300 may be formed in a conductive pattern with a second contact portion 300C, a bonding pad portion 300P, and a line portion 300L. The second contact portions 300C of the second redistribution layer patterns 300 may be portions of the second redistribution layer pattern 300 that substantially penetrate the second dielectric layer (610 in FIG. 1) to be connected to the lower first redistribution layer pattern 200, The bonding pad portions 300P of the second redistribution layer patterns 300 may overlap with the first redistribution layer pattern 200 and may be disposed next to each other. The bonding pad portions 300P of the second redistribution layer patterns 300 may be conductive patterns to which the bonding wires (800 of FIG. 1) are connected. The line portions 300L of the second redistribution layer patterns 300 may be conductive patterns that connect the second contact portions 300C of the second redistribution layer patterns 300 and the bonding pad portions 300P of the second redistribution layer patterns 300 to each other. The line portions 300L of the second redistribution layer patterns 300 may extend from the second contact portions 300C of the second redistribution layer patterns 300 to be connected to the bonding pad portions 300P of the second redistribution layer patterns 300.

Referring to FIGS. 2 and 1, the first redistribution layer pattern 200 may substantially overlap with the second redistribution layer patterns 300. In a cross-section side view, the first redistribution layer pattern 200 may be disposed at a position that is spaced apart from the bonding pad portions 300P of the second redistribution layer patterns 300 by a predetermined distance in a direction that is substantially perpendicular to the semiconductor substrate 100.

Referring to FIGS. 1, 2, and 4, second contact patterns 200-1 that are spaced apart from the first redistribution layer pattern 200 may be formed as conductive patterns. A third contact portions 200C-1, which are portions of the second contact patterns 200-1, may be connected to other conductive patterns underneath. Similar to the first contact portion 200C of the first redistribution layer pattern 200 being connected to the first contact pattern 750, the third contact portions 200C-1 of the second contact patterns 200-1 may be connected to conductive patterns that are similar to the first contact pattern 705 that is connected to the first redistribution layer pattern 200. The second contact patterns 200-1 may be third redistribution layer patterns that are separated from the first redistribution layer pattern 200, The plate portion 200A of the first redistribution layer pattern 200 may be a large-area pattern that covers the semiconductor substrate 100 or the first dielectric layer 500. The plate portion 200A of the first redistribution layer pattern 200 may be a conductive pattern with a larger area than the pad overlapping portions 200S or the second contact patterns 200-1.

A portion of the plate portion 200A of the first redistribution layer pattern 200 may be connected to the second contact portion 300C of the second redistribution layer pattern 300. The plate portion 200A of the first redistribution layer pattern 200 may be electrically connected to the second redistribution layer patterns 300 and the bonding pad portions 300P through the second contact portions 300C of the second redistribution layer patterns 300. The plate portion 200A of the first redistribution layer pattern 200, the second redistribution layer patterns 300, and the bonding pad portions 300P may provide a path to supply power, such as VDD, to an integrated circuit that is configured in the semiconductor substrate 100, On the other hand, the plate portion 200A of the first redistribution layer pattern 200, the second redistribution layer patterns 300, and the bonding pad portions 300P may provide a path to ground the integrated circuit that is configured in the semiconductor substrate 100, for example, paths through which OSS is connected.

Referring to FIG. 2, the first redistribution layer pattern 200 may be a conductive pattern with a wider width W1 than the second redistribution layer pattern 300. The width W1 of the plate portion 200A of the first redistribution layer pattern 200 may be wider than a width W2 of the bonding pad portion 300P of the second redistribution layer pattern 300. The width W1 of the plate portion 200A of the first redistribution layer pattern 200 may be wider than a width W3 of the line portion 300L of the second redistribution layer pattern 300. As such, because the plate portion 200A of the first redistribution layer pattern 200 has a wide width W1, the first redistribution layer pattern 200 may contribute to improving the power distribution network (PDN).

The plate portion 200A of the first redistribution layer pattern 200 has a wide width W1 so that the plurality of second redistribution layer patterns 300 may be disposed on the first redistribution layer pattern 200. The plurality of second redistribution layer patterns 300 may substantially overlap with the first redistribution layer pattern 200. The line portions 300L of the plurality of second redistribution layer patterns 300 may overlap on the plate portion 200A of the first redistribution layer pattern 200. Referring to FIGS. 2 and 4, the bonding pad portions 300P of the second redistribution layer patterns 300 may be overlapped on the pad overlapping portion 200S of the first redistribution layer pattern 200. The plurality of bonding pad portions 300P may be disposed to substantially overlap with the first redistribution layer pattern 200.

Referring to FIGS. 2 and 4, the second contact patterns 200-1 may be conductive patterns that are electrically connected to some of the second redistribution layer patterns 300B except for the second redistribution layer pattern 300A that is connected to the first redistribution layer pattern 200. The second redistribution layer patterns 300B may be connected to the second contact patterns 200-1 through the second contact portions 300C. Because the second contact patterns 200-1 are spaced apart and electrically separated from the plate portion 200A of the first redistribution layer pattern 200, the second redistribution layer patterns 300B might not be electrically connected to the plate portion 200A of the first redistribution layer pattern 200, The second contact patterns 200-1 and the second redistribution layer patterns 300B that are connected thereto may provide a path through which data signals are transmitted to an integrated circuit that is formed in the semiconductor substrate 100.

Referring to FIGS. 1, 2, and 4, the semiconductor device 10 or the semiconductor chip 11 may include the recognition marks 400. The recognition marks 400 may accentuate or indicate the bonding pad portions 300P when attempting to detect the bonding pad portions 300P of the second redistribution layer patterns 300 as an image. The recognition mark 400 may have a shape or a pattern that is capable of illustrating a different color or different contrast compared to that of the bonding pad portion 300P of the second redistribution layer pattern 300 or the first redistribution layer pattern 200. The recognition marks 400 may be configured to display a different color or a different contrast compared to the first redistribution layer pattern 200 or the bonding pad portions 300P when it is difficult to distinguish the bonding pad portions 300P of the second redistribution layer patterns 300 from the first redistribution layer pattern 200 in the detected image. Because the recognition marks 400 may be distinguished from the image, the recognition marks 400 may be detected, and accordingly, it may be possible to detect the positions of the bonding pad portions 300P that are indicated by the recognition marks 400.

The recognition marks 400 may be formed on the first redistribution layer pattern 200. In a plan view, each of the recognition marks 400 may be formed in a pattern with a shape of arc that surrounds each of the bonding pad portions 300P as illustrated in FIG. 2.

Referring to FIGS. 1, 2, and 4, each of the recognition marks 400 may include a trench portion 402 from which a portion of the first redistribution layer pattern 200 is removed. The trench portions 402 may be formed to penetrate the first redistribution layer pattern 200 in a substantially vertical direction. The trench portions 402 may be filled with the second dielectric layer 610. While the second dielectric layer 610 is formed to cover the first redistribution layer pattern 200, the second dielectric layer 610 may fill the trench portions 402 as well. The second dielectric layer 610 may include a layer of a polymer material, such as polyimide-isoindoloquinazolinedione (PIQ).

Each of the trench portions 402 may be formed in the shape of a loop that separates the first redistribution layer pattern 200 into the plate portion 200A and the pad overlapping portions 200S, as illustrated in FIG. 4. Because each of the trench portions 402 has a loop shape that surrounds the pad overlapping portion 200S, the trench portion 402 may be recognized as an arc shape that surrounds the bonding pad portion 300P as illustrated in FIG. 2 in a plan view. In this plan view, the bonding pad portions 300P may be disposed such that their edges substantially contact the trench portions 402.

Referring to FIGS. 1 and 4, because the trench portions 402 pass through the first redistribution layer pattern 200, mark regions 405 may be exposed at the bottom of the trench portions 402. The mark regions 405 and the trench portions 402 may configure the recognition marks 400 together. Each of the mark regions 405 may be formed as a layer that exhibits a different color or provides a different contrast compared to that of the bonding pad portion 300P and the first redistribution layer pattern 200.

The mark regions 405 may be portions that are exposed by the trench portions 402 of the first dielectric layer (500 in FIG. 1). The first redistribution layer pattern 200, the second redistribution layer patterns 300, or the bonding pad portion 300P may include a metal layer. The first redistribution layer pattern 200, the second redistribution layer pattern 300, or the bonding pad portion 300P may be formed as a layer with substantially the same metal material. On the other hand, when the first dielectric layer 500 is detected as an image, the first dielectric layer 500 may be composed of a layer with a different color or different contrast from the metal layer.

The first dielectric layer 500 may include a layer of an insulating material. The first dielectric layer 500 may include a silicon oxide ($SiO_2$) layer. The first dielectric layer 500 may include a silicon nitride ($Si_3N_4$) layer. The first dielectric layer 500 may include a double layer, a composite layer, or a multilayer with a silicon oxide layer and a silicon nitride layer. The layer of insulating material may exhibit a different color or different contrast compared to that of the layer of metal material when detected or photographed as an image.

Accordingly, when the bonding pad portions 300P are to be detected as an image, the recognition marks 400 or the mark regions 405 may be detected as image shapes that are distinguished from the first redistribution layer pattern 200. On the other hand, because the bonding pad portions 300P and the first redistribution layer pattern 200 are formed of layers of substantially the same or similar metal material, it is difficult to distinguish the image shapes of the bonding pad portions 300P from the image shape of the first redistribution layer pattern 200. However, the recognition marks 400 or the mark regions 405 that are detected as distinct image shapes may provide an outline of the bonding pad portions 300P. In this way, because the bonding pad portions 300P may be recognized in the image shapes of the recognition marks 400, it is possible to detect the positions of the bonding pad portions 300P or recognize the bonding pad portions 300P as images by recognizing the recognition marks 400.

Figure 5:
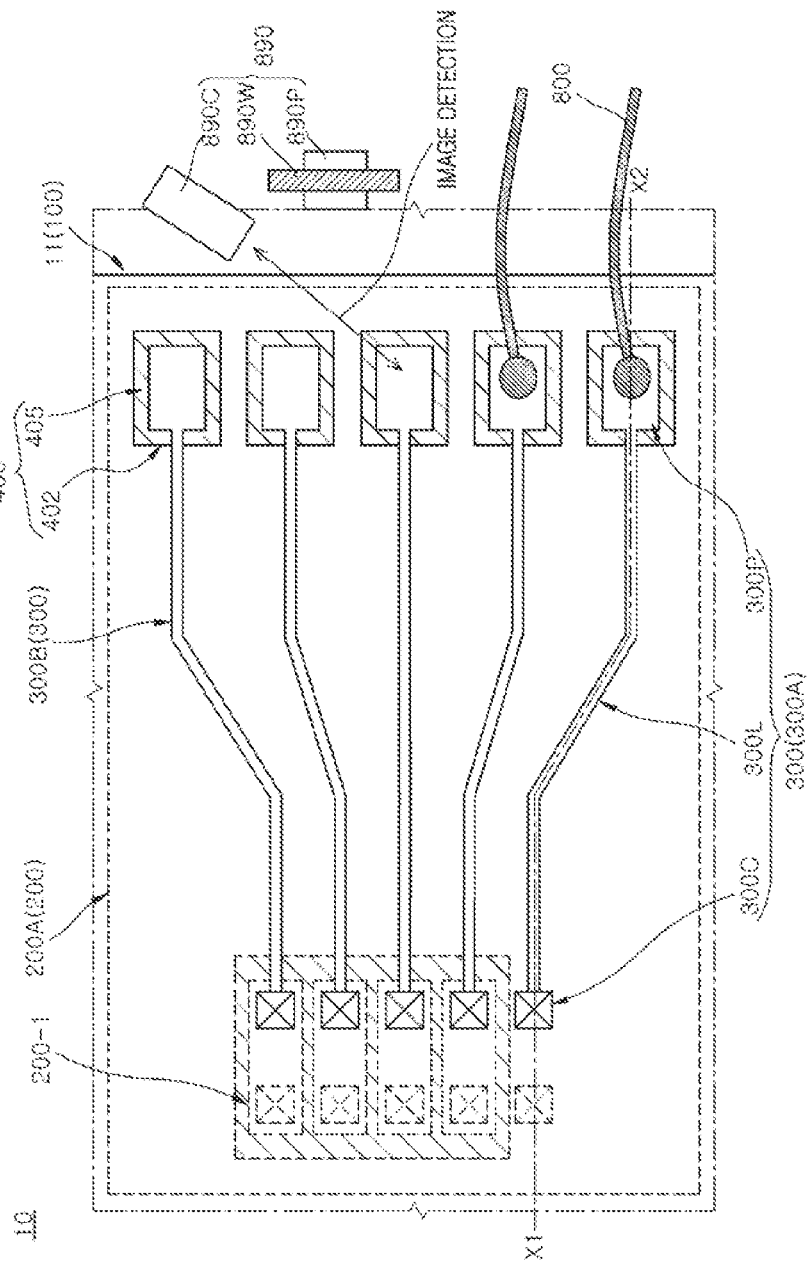
FIG. 5 is a schematic view illustrating formation of bonding wires in the semiconductor device of FIG. 1.

FIG. 5 is a schematic view illustrating a process of forming the bonding wire 800 of the semiconductor device 10 of FIG. 1 and a process apparatus 890 for performing the process.

Referring to FIGS. 1 and 5, the process of bonding the bonding wire 800 to the bonding pad portion 300P of the semiconductor device 10 or the semiconductor chip 11 may be performed by the process apparatus 890 through a wire bonding process. The process apparatus 890 may include a capillary 890P that draws a bonding wire 890W and bonds the bonding wire 890W to the bonding pad portion 300P. The process apparatus 890 may further include a detector 890C that detects the bonding pad portion 300P to which the bonding wire 800 is to be bonded. The detector 890C may acquire an image of a surface of the semiconductor device 10 or semiconductor chip 11, or the detector 890C may acquire an image of the bonding pad portion 300P or an image including the bonding pad portion 300P, the adjacent recognition mark 400, and a partial portion of the adjacent first redistribution layer pattern 200. The detector 890C may include a camera for acquiring an image.

The process apparatus 890 may recognize the positions of the bonding pad portions 300P by distinguishing the recognition marks 400 from the captured image. The process apparatus 890 may move the capillary 890P to the recognized positions of the bonding pad portions 300P and may perform an operation of bonding the bonding wire 800 to the bonding pad portions 300P. Even if it is difficult to distinguish the bonding pad portions 300P and the first redistribution layer pattern 200 through an image, the recognition mark 400 may be distinguished through an image so that the process apparatus 890 may recognize the outline shapes of the bonding pad portions 300P or the positions of the bonding pad portions 300P. Accordingly, a wire bonding process defect that is caused by difficulty in recognizing the bonding pad portions 300P may be improved.

Figure 6:
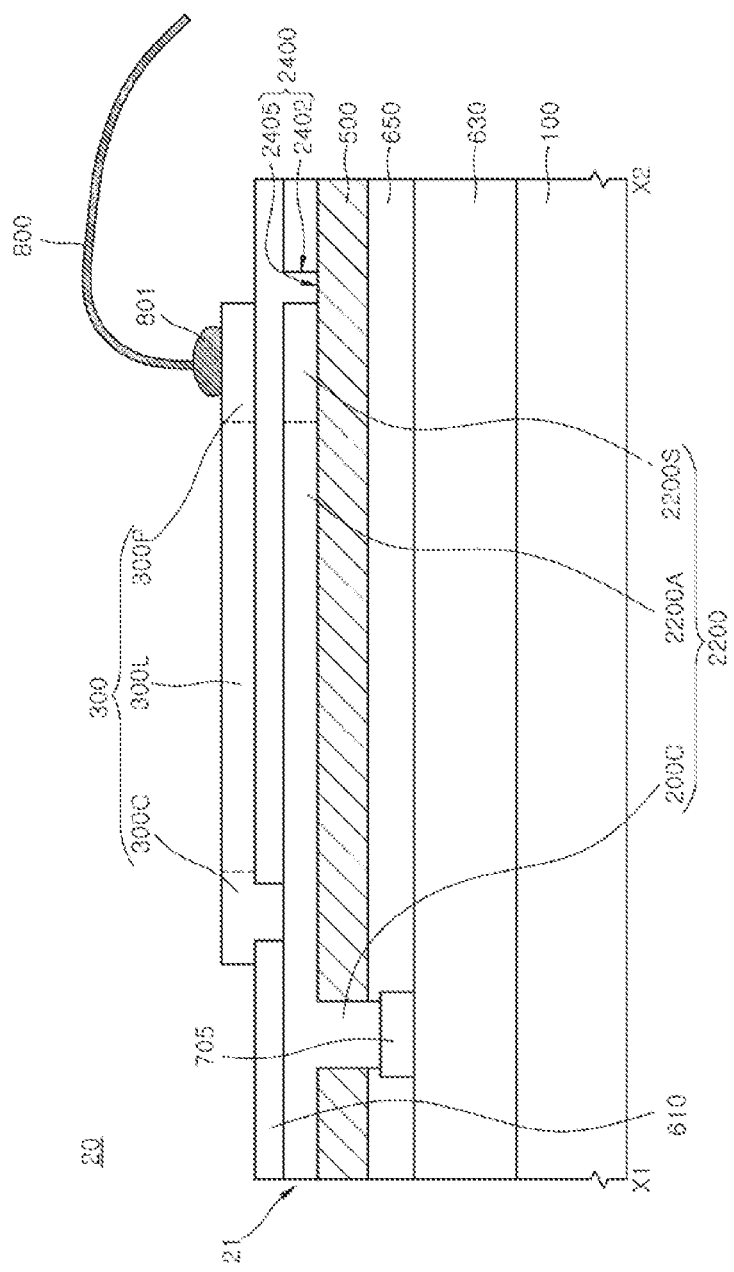
FIG. 6 is a schematic cross-sectional view illustrating a cross-sectional shape of a semiconductor device according to another embodiment of the present disclosure.
Figure 7:
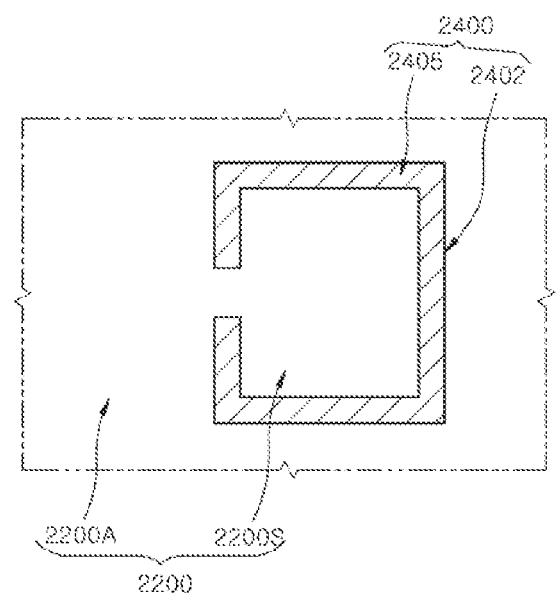
FIG. 7 is a schematic plan view illustrating a planar shape of a pad recognition mark of the semiconductor device of FIG. 6.

FIG. 6 is a schematic cross-sectional view illustrating a cross-sectional shape of a semiconductor device 20 according to another embodiment of the present disclosure. FIG. 7 is a schematic plan view illustrating a planar shape of a pad recognition mark 2400 of the semiconductor device 20 of FIG. 6. Among the reference numerals illustrated in FIGS. 6 and 7, the same reference numerals as those described in FIGS. 1 to 5 may indicate the same elements.

Referring to FIGS. 6 and 7, the semiconductor device 20 or a semiconductor chip 21 may include a first redistribution layer pattern 2200, a second redistribution layer pattern 300, and a recognition mark 2400, The first redistribution layer pattern 2200 may be a conductive pattern with a pad overlapping portion 2200S and a plate portion 2200k The second redistribution layer pattern 300 may be a conductive pattern with a bonding pad portion 300P to which a bonding wire 800 is bonded. The pad overlapping portion 2200S of the first redistribution layer pattern 2200 may be a pattern that overlaps with the bonding pad portion 300P of the second redistribution layer pattern 300.

A trench portion 2402 may be formed by removing a portion of the first redistribution layer pattern 2200. The trench portion 2402 may have a pattern shape that partitions the pad overlapping portion 2200S of the first redistribution layer pattern 2200. The trench portion 2402 may have an arc shape that surrounds the pad overlapping portion 2200S of the first redistribution layer pattern 2200. The trench portion 2402 and a mark region 2405 of a first dielectric layer 500 that are exposed at a bottom of the trench portion 2402 may configure the recognition mark 2400.

Figure 8:
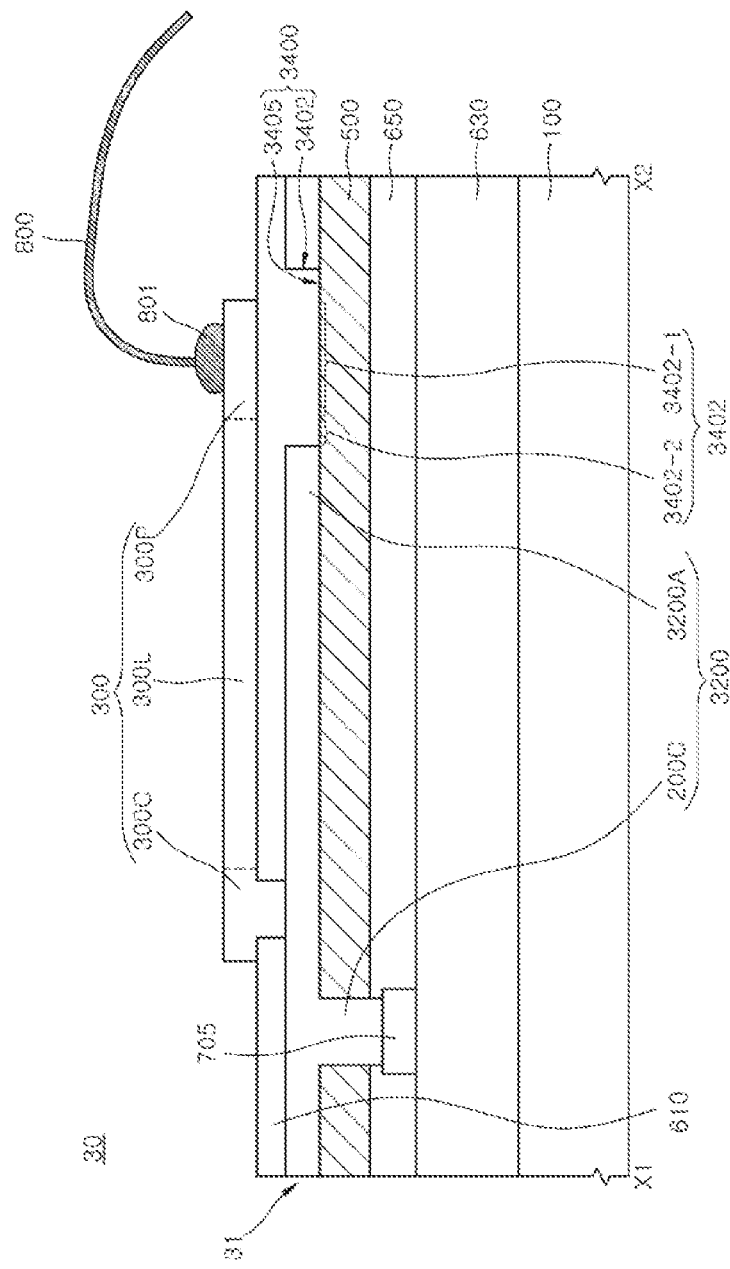
FIG. 8 is a schematic cross-sectional view illustrating a cross-sectional shape of a semiconductor device according to another embodiment of the present disclosure.
Figure 9:
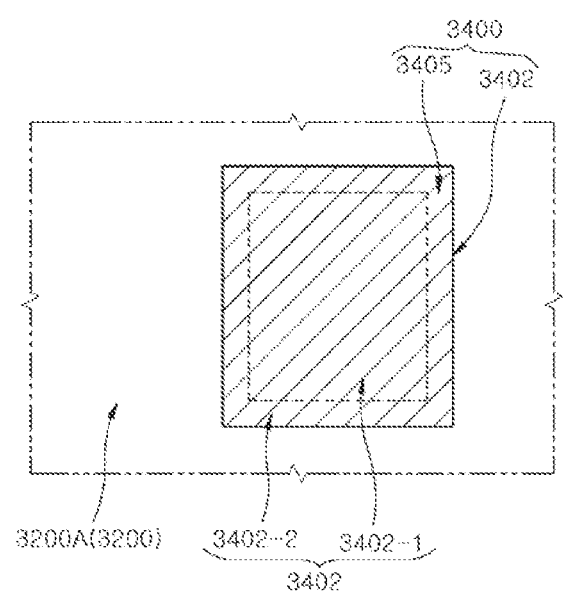
FIG. 9 is a schematic plan view illustrating a planar shape of the pad recognition mark of the semiconductor device of FIG. 8.

FIG. 8 is a schematic cross-sectional view illustrating a semiconductor device 30 according to another embodiment of the present disclosure. FIG. 9 is a schematic plan view illustrating a planar shape of a recognition mark 3400 of the semiconductor device 30 of FIG. 8, Among the reference numerals illustrated in FIGS. 8 and 9, the same reference numerals as those described in FIGS. 1 to 5 may indicate the same elements.

Referring to FIGS. 8 and 9, the semiconductor device 30 or a semiconductor chip 31 may include a first redistribution layer pattern 3200, a second redistribution layer pattern 300, and a recognition mark 3400. The first redistribution layer pattern 3200 may be a conductive pattern with a plate portion 3200A. The second redistribution layer pattern 300 may be a conductive pattern with a bonding pad portion 300P to which a bonding wire 800 is bonded. The first redistribution layer pattern 3200 may include an opening portion 3402 from which a portion of the first redistribution layer pattern 3200 is removed. The opening portion 3402 may overlap with the bonding pad portion 300P of the second redistribution layer pattern 300.

The opening portion 3402 may include an inner region 3402-1 and an edge region 3402-2, as illustrated in FIG. 9. The edge region 3402-2 of the opening portion 3402 may indicate a circular-shaped region or a loop-shaped region that surrounds the inner region 3402-1. The bonding pad portion 300P may be disposed to overlap with the inner region 3402-1 of the opening portion 3402 and may expose the edge region 3402-2 of the opening portion 3402. In the bonding pad portion 300P, a mark region 3405 of a first dielectric layer 500 may be exposed in the edge region 3402-2 of the opening portion 3402. The recognition mark 3400 may include the opening portion 3402 and the mark region 3405.

Figure 10:
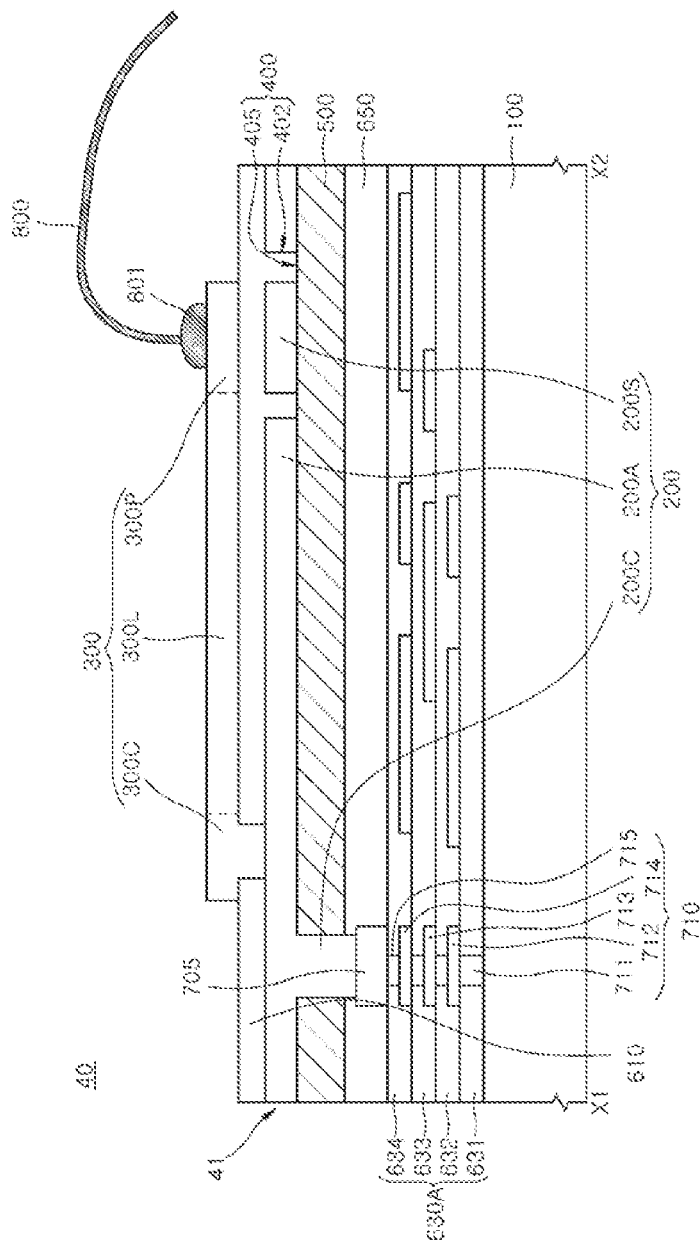
FIG. 10 is a schematic cross-sectional view illustrating a cross-sectional shape of a semiconductor device according to another embodiment of the present disclosure.

FIG. 10 is a schematic cross-sectional view illustrating a cross-sectional shape of a semiconductor device 40 according to another embodiment of the present disclosure. Among the reference numerals illustrated in FIG. 10, the same reference numerals as those described in FIGS. 1 to 5 may indicate the same elements.

Referring to FIG. 10, the semiconductor device 40 or a semiconductor chip 41 may include a first redistribution layer pattern 200, a second redistribution layer pattern 300, and a recognition mark 400. A first dielectric layer 500 may be formed under the first redistribution layer pattern 200. A fourth dielectric layer 650 may be formed under the first dielectric layer 500. A third dielectric layer 630A may be formed under the fourth dielectric layer 650. The third dielectric layer 630A may be formed between a semiconductor substrate 100 and the first dielectric layer 500.

The third dielectric layer 630A may include a structure in which a plurality of intermetal dielectric layers 631, 632, 633, and 634 are stacked. A first intermetal dielectric layer 631, a second intermetal dielectric layer 632, a third intermetal dielectric layer 633, and a fourth intermetal dielectric layer 634 may be sequentially formed on the semiconductor substrate 100. The third dielectric layer 630A may include a low-k dielectric material. The low-k dielectric material may indicate a material with a lower dielectric constant k than that of silicon oxide ($SiO_2$).

The intermetal dielectric layers 631, 632, 633, and 634 may be formed of low-k dielectric material. Some of the intermetal dielectric layers 631, 632, 633, and 634, for example, the second intermetal dielectric layer 632 and the third intermetal dielectric layer 633, may be formed of low-k dielectric material. The first intermetal dielectric layer 631 and the fourth intermetal dielectric layer 634 may be formed of an insulating material with a higher density than the low-k dielectric material. The first intermetal dielectric layer 631 and the fourth intermetal dielectric layer 634 may include a silicon oxide layer, prepared by materials such as tetraethyl orthosilicate (TEOS). The fourth dielectric layer 650 that is formed on the fourth intermetal dielectric layer 634 may include a silicon oxide layer.

Metallization layers 712, 713, and 714 may be disposed between each of the intermetal dielectric layers 631, 632, 633, and 634. Each of the metallization layers 712, 713, and 714 may include a metal material such as copper (Cu), Patterns of the first metallization layer 712 may be formed on the first intermetal dielectric layer 631. Patterns of the second metallization layer 713 may be formed on the second intermetal dielectric layer 632. Patterns of the third metallization layer 714 may be formed on the third intermetal dielectric layer 633. Conductive vias 711 and 715 may be formed in the structures of the intermetal dielectric layers 631, 632, 633, and 634. The first conductive via 711 may substantially penetrate the first intermetal dielectric layer 631 and may be connected to the first metallization layer 712. The second conductive vias 715 may substantially penetrate the fourth intermetal dielectric layer 634 and may connect the third metallization layer 714 to the first contact pattern 705. The second conductive vias 715 may also substantially penetrate the second and third intermetal dielectric layers 632 and 633 to provide additional interconnections. The first and second conductive vias 711 and 715 may include a metal material such as tungsten (W). As such, a multilayer metallization layer structure may be configured to include the conductive vias 711 and 715, the metallization layers 712, 713, and 714, and the intermetal dielectric layers 631, 632, 633, and 634.

Layers of the low-k dielectric material may be more susceptible to moisture absorption than silicon oxide. The first redistribution layer pattern 200 may be positioned on an upper side of the semiconductor substrate 100 and may block moisture from penetrating into the low-k dielectric material layers. Because the first redistribution layer pattern 200 has a pattern shape with a wide width W1, as illustrated in FIG. 2, it is possible to effectively prevent moisture from penetrating into the semiconductor substrate 100 from the outside.

Referring again to FIGS. 1 and 2, the semiconductor device 10, according to an embodiment of the present disclosure, may include the first redistribution layer pattern 200 that is formed on the semiconductor substrate 100 and may include the plurality of trench portions 402 that expose the recognition marks 400. In a plan view, the semiconductor device 10 may further include the plurality of bonding pad portions 300P that overlaps with the first redistribution layer pattern 200 so that the edges thereof contact the trench portions 402, The semiconductor device 10 may further include the bonding wires 800 bonded to the bonding pad portions 300P.

Figure 11:
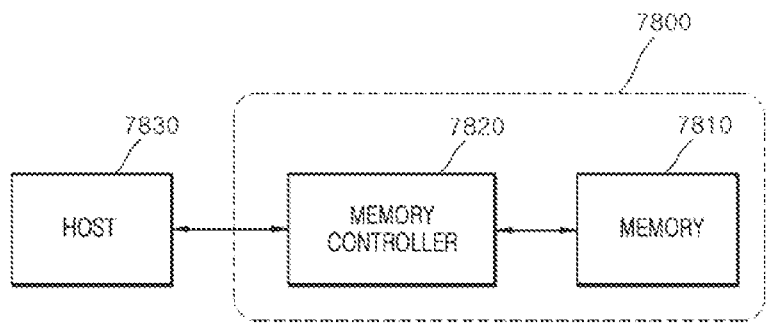
FIG. 11 is a block diagram illustrating an electronic system employing a memory card including a package according to an embodiment of the present disclosure.

The semiconductor device 10, according to another embodiment of the present disclosure, may include the first redistribution layer pattern 200 that is formed on the semiconductor substrate 100. The semiconductor device 10 may further include the second redistribution layer pattern 300 that is disposed on the first redistribution layer pattern 200. The second redistribution layer pattern 300 may provide the bonding pad portions 300P that overlap with the first redistribution layer pattern 200. In a plan view, the semiconductor device 10 may include the trench portions 402 that are formed in the first redistribution layer pattern 200 in shapes that surround the bonding pad portions 300P, FIG. 11 is a block diagram illustrating an electronic system including a memory card 7800 that employs at least one of the semiconductor packages according to the embodiments. The memory card 7800 may include a memory 7810, such as a nonvolatile memory device, and a memory controller 7820. The memory 7810 and the memory controller 7820 may store data or read out the stored data. At least one among the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 12:
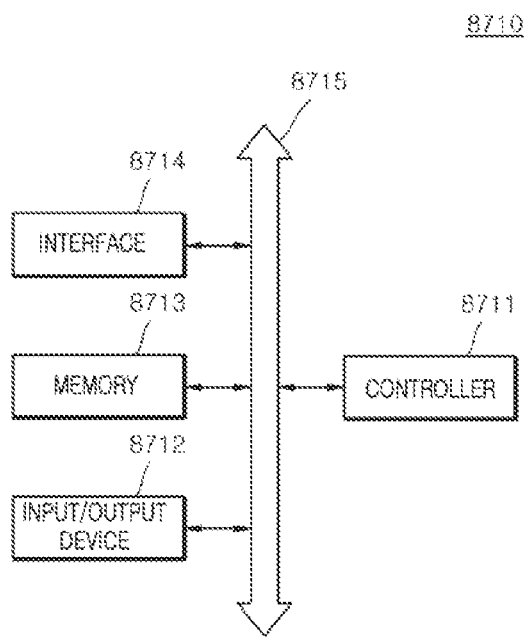
FIG. 12 is a block diagram illustrating an electronic system including a package according to an embodiment of the present disclosure.

FIG. 12 is a block diagram illustrating an electronic system 8710 including at least one of the semiconductor packages according to the embodiments. The electronic system 8710 may include a controller 8711, an input/output device 8712, and a memory 8713. The controller 8711, the input/output device 8712, and the memory 8713 may be coupled with one another through a bus 8715 that provides a path through which data move.

In an embodiment, the controller 8711 may include one or more microprocessor, digital signal processor, microcontroller, and/or logic device that is capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 may be a device for storing data. The memory 8713 may store data and/or commands to be executed by the controller 8711, and the like.

The memory 8713 may include a volatile memory device, such as a DRAM, and/or a nonvolatile memory device, such as a flash memory. For example, a flash memory may be mounted to an information processing system, such as a mobile terminal or a desktop computer. The flash memory may constitute a solid-state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The inventive concept has been disclosed in conjunction with some embodiments as described above, Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A semiconductor device comprising:
   a first redistribution layer pattern formed on a semiconductor substrate;
   a second redistribution layer pattern, with a bonding pad portion, disposed on the first redistribution layer pattern; and
   a recognition mark formed on the first redistribution layer pattern to indicate a position of the bonding pad portion,
   wherein the recognition mark is spaced apart from the bonding pad portion.

2. The semiconductor device of claim 1, wherein the second redistribution layer pattern substantially overlaps with the first redistribution layer pattern.

3. The semiconductor device of claim 1,
   wherein the second redistribution layer pattern further includes a line portion that extends from the bonding pad portion,
   wherein the first redistribution layer pattern further includes a plate portion in which the line portion of the second redistribution layer pattern is overlapped, and
   wherein the plate portion of the first redistribution layer pattern has a wider width than the line portion and the bonding pad portion of the second redistribution layer pattern.

4. The semiconductor device of claim 1, wherein a plurality of the second redistribution layer patterns are disposed to substantially overlap with the first redistribution layer pattern.

5. The semiconductor device of claim 1, wherein the recognition mark has an arc shape that surrounds the bonding pad portion in a plan view.

6. The semiconductor device of claim 1, wherein the recognition mark includes a trench portion from which a portion of the first redistribution layer pattern is removed.

7. The semiconductor device of claim 6, wherein the first redistribution layer pattern further includes a pad overlapping portion that overlaps with the bonding pad portion of the second redistribution layer pattern, and
wherein the trench portion has a loop shape that surrounds the pad overlapping portion of the first redistribution layer pattern.

8. The semiconductor device of claim 6, wherein the first redistribution layer pattern further includes a pad overlapping portion overlapping with the bonding pad portion of the second redistribution layer pattern, and
wherein the trench portion has an arc shape that surrounds the pad overlapping portion of the first redistribution layer pattern.

9. The semiconductor device of claim 6, wherein the trench portion vertically penetrates the first redistribution layer pattern.

10. The semiconductor device of claim 9, further comprising a first dielectric layer formed between the semiconductor substrate and the first redistribution layer pattern,
wherein the first dielectric layer includes a mark region that is exposed due to the trench portion, and
wherein the mark region provides a different color or a different contrast from the bonding pad portion and the first redistribution layer pattern.

11. The semiconductor device of claim 10, wherein the first dielectric layer includes a silicon oxide layer, a silicon nitride layer, or a double layer with silicon oxide and silicon nitride.

12. The semiconductor device of claim 6, further comprising a second dielectric layer covering the first redistribution layer pattern and filling the trench portion.

13. The semiconductor device of claim 12, further comprising:
a third dielectric layer including a low-k dielectric material between the first dielectric layer and the semiconductor substrate; and
a metallization layer disposed in the third dielectric layer.

14. The semiconductor device of claim 1, further comprising a bonding wire bonded to the bonding pad portion.

15. The semiconductor device of claim 1, wherein the first redistribution layer pattern, the second redistribution layer pattern, and the bonding pad portion include the same metal material.

16. A semiconductor device comprising:
a first redistribution layer pattern formed on a semiconductor substrate;
a second redistribution layer pattern, with a bonding pad portion, disposed on the first redistribution layer pattern; and
a recognition mark to indicate a position of the bonding pad portion,
wherein the recognition mark includes an opening portion from which a portion of the first redistribution layer pattern is removed, and
wherein the bonding pad portion is disposed to overlap an inner region of the opening portion and to expose an edge region of the opening portion.

17. A semiconductor device comprising:
a redistribution layer pattern formed on a semiconductor substrate, the redistribution layer pattern including a plurality of trench portions that expose recognition marks;
a plurality of bonding pad portions overlapping with the redistribution layer pattern such that edges thereof contact the trench portions in a plan view; and
bonding wires bonded to the bonding pad portions,
wherein the recognition mark is spaced apart from the bonding pad portion.

18. The semiconductor device of claim 17, wherein the trench portions vertically penetrate the redistribution layer pattern.

19. The semiconductor device of claim 18, further comprising a dielectric layer formed between the semiconductor substrate and the redistribution layer pattern,
wherein the dielectric layer includes mark regions that are exposed due to the trench portions, and
wherein each of the mark regions provides a different color or a different contrast from the bonding pad portions and the redistribution layer pattern.

20. The semiconductor device of claim 19, further comprising:
intermetal dielectric (IMD) layers including a low-k dielectric material between the dielectric layer and the semiconductor substrate; and
metallization layers disposed between the intermetal dielectric layers.

21. A semiconductor device comprising:
a first redistribution layer pattern formed on a semiconductor substrate;
a second redistribution layer pattern, with a bonding pad portion that overlaps with the first redistribution layer pattern, disposed on the first redistribution layer pattern; and
a trench portion formed in the first redistribution layer pattern in a shape that surrounds the bonding pad portion in a plan view,
wherein the trench portion is spaced apart from the bonding pad portion.

22. The semiconductor device of claim 21, wherein the first redistribution layer pattern further includes a pad overlapping portion that overlaps with the bonding pad portion of the second redistribution layer pattern, and
wherein the trench portion has a loop shape that surrounds the pad overlapping portion of the first redistribution layer pattern.

23. The semiconductor device of claim 21, wherein the first redistribution layer pattern further includes a pad overlapping portion that overlaps with the bonding pad portion of the second redistribution layer pattern, and
wherein the trench portion has an arc shape that surrounds the pad overlapping portion of the first redistribution layer pattern.

24. The semiconductor device of claim 21, further comprising a first dielectric layer formed between the semiconductor substrate and the first redistribution layer pattern,
wherein the first dielectric layer includes a mark region that is exposed due to the trench portion, and
wherein the mark region provides a different color or a different contrast from the bonding pad portion and the first redistribution layer pattern.

25. The semiconductor device of claim 24, further comprising a second dielectric layer covering the first redistribution layer pattern and filling the trench portion.

26. The semiconductor device of claim 21, further comprising a bonding wire bonded to the bonding pad portion.

27. The semiconductor device of claim 21, further comprising:
- a third dielectric layer including a low-k dielectric material between the first dielectric layer and the semiconductor substrate; and
- a metallization layer disposed in the third dielectric layer.

\* \* \* \* \*